United States Patent
Simpson

(10) Patent No.: US 11,195,784 B2
(45) Date of Patent: Dec. 7, 2021

(54) SEMICONDUCTOR DEVICE SUB-ASSEMBLY

(71) Applicants: Zhuzhou CRRC Times Electric Co. Ltd., Hunan (CN); Dynex Semiconductor Limited, Lincolnshire (GB)

(72) Inventor: Robin Adam Simpson, Lincolnshire (GB)

(73) Assignee: DYNEX SEMICONDUCTOR LIMITED, Hunan (GB)

( * ) Notice: Subject to any disclaimer, the term of this patent is extended or adjusted under 35 U.S.C. 154(b) by 13 days.

(21) Appl. No.: 16/311,780

(22) PCT Filed: Jun. 20, 2016

(86) PCT No.: PCT/GB2016/051842
§ 371 (c)(1),
(2) Date: Dec. 20, 2018

(87) PCT Pub. No.: WO2017/220949
PCT Pub. Date: Dec. 28, 2017

(65) Prior Publication Data
US 2019/0206776 A1    Jul. 4, 2019

(51) Int. Cl.
H01L 23/498    (2006.01)
H01L 23/00    (2006.01)
H01L 25/11    (2006.01)

(52) U.S. Cl.
CPC .. H01L 23/49811 (2013.01); H01L 23/49844 (2013.01); H01L 24/72 (2013.01);
(Continued)

(58) Field of Classification Search
None
See application file for complete search history.

(56) References Cited

U.S. PATENT DOCUMENTS 4,218,695 A    8/1980    Egerbacher et al.
4,224,663 A *  9/1980    Maiese ............... H01L 23/4006
                                                       257/719
(Continued)

FOREIGN PATENT DOCUMENTS

CN    201708683 U    1/2011
CN    103579165 A    2/2014
(Continued)

OTHER PUBLICATIONS

International Search Report and Written Opinion for corresponding international application No. PCT/GB2016/051842, dated Oct. 31, 2016.
(Continued)

*Primary Examiner* — Nishath Yasmeen
(74) *Attorney, Agent, or Firm* — Tarolli, Sundheim, Covell & Tummino LLP

(57) ABSTRACT

We disclose herein a semiconductor device sub-assembly comprising: a plurality of semiconductor units laterally spaced to one another; a semiconductor unit locator comprising a plurality of holes, wherein each semiconductor unit is located in each hole of the semiconductor unit locator; a plurality of pressure means for applying pressure to each semiconductor unit, and a conductive malleable layer located between the plurality of pressure means and the semiconductor unit locator.

20 Claims, 9 Drawing Sheets

(52) U.S. Cl.
CPC .............. H01L 24/90 (2013.01); H01L 24/97 (2013.01); H01L 25/115 (2013.01); *H01L 2924/1203* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 4,609,937 A | 9/1986 | Takeuchi et al. | |
| 4,672,422 A | 6/1987 | Schierz | |
| 5,866,944 A * | 2/1999 | Hiyoshi | H01L 24/72 257/719 |
| 5,874,774 A * | 2/1999 | Takahashi | H01L 25/115 257/688 |
| 5,990,501 A | 11/1999 | Hiyoshi et al. | |
| 5,994,773 A * | 11/1999 | Hirakawa | H01L 21/486 257/668 |
| 6,020,597 A * | 2/2000 | Kwak | H01L 23/5387 257/48 |
| 6,058,014 A * | 5/2000 | Choudhury | H05K 3/325 257/719 |
| 6,181,007 B1 * | 1/2001 | Yamazaki | H01L 23/051 257/718 |
| 6,320,268 B1 * | 11/2001 | Lang | H01L 24/72 257/177 |
| 6,373,129 B1 * | 4/2002 | Yamazaki | H01L 23/051 257/181 |
| 6,678,163 B1 * | 1/2004 | Neal | H01L 23/051 257/726 |
| 7,187,074 B2 * | 3/2007 | Uchiyama | H01R 13/2421 257/177 |
| 9,076,752 B2 * | 7/2015 | Kojima | H01L 23/4093 |
| 9,093,426 B2 * | 7/2015 | Permuy | H01L 25/072 |
| 9,601,473 B2 * | 3/2017 | Golland | H01L 23/3675 |
| 2015/0102383 A1 * | 4/2015 | Golland | H01L 23/3675 257/140 |
| 2016/0079134 A1 | 3/2016 | Miyake et al. | |

FOREIGN PATENT DOCUMENTS

| | | |
|---|---|---|
| CN | 104966704 A | 10/2015 |
| JP | 2004158489 A | 6/2004 |

OTHER PUBLICATIONS

Chinese Office Action for Application No. 201680006071.X dated Jul. 30, 2019.

Chinese Office Acton for Application No. 201680006071.X dated Feb. 6, 2020.

Makan Chen et al., ABB High power semiconductors for T&D and industry application: StakPak & IGCT introduction, Nov. 10, 2014.

ABB StakPak: IGBT press-pack modules, 2015.

IXYS UK Westcode Application note for device mounting instructions, Feb. 13, 2015.

Tinschert et al., Possible failure modes in Press-Pack IGBTs, Feb. 19, 2015.

Frank, Power Cycle Testing of Press-Pack IGBT Chips, Jun. 2014.

\* cited by examiner

SEMICONDUCTOR DEVICE SUB-ASSEMBLY

RELATED APPLICATIONS

The present invention is a U.S. National Stage under 35 USC 371 patent application, claiming priority to Serial No. PCT/GB2016/051842, filed on 20 Jun. 2016, the entirety of which is incorporated herein by reference.

FIELD OF INVENTION

The present invention relates to a semiconductor device sub-assembly.

BACKGROUND OF THE INVENTION

For optimum performance of the multiple chip device, the following requirements must be met:
The pressure distribution across each chip and between chips should be uniform;
The applied pressure should be within a defined operating range.

In traditional designs, semiconductor chips are placed between mechanical strain buffers, such as molybdenum or tungsten, to form a semiconductor unit. These semiconductor units are then placed between two common copper electrodes (see FIG. 9 for an illustration of this). For optimum performance, in terms of current handling capability and reliability, the pressure distribution across the chips within the package should be as uniform as possible. This is difficult to achieve, as micron-level differences in semiconductor unit thickness or surface flatness variations across the copper electrodes can lead to applied pressures that differ greatly between semiconductor chips and also differ from the intended target pressure. The flatness and parallelism of components, such as heatsinks in the end-users' application will also have a significant effect on this. The effect is amplified in cases where multiple devices are clamped in a single stack for series operation, due to the additive effect of all of the tolerances within the stack. The inventor has appreciated that there are applications where up to twenty such devices are clamped in a single stack (see prior art 1 below).

It is known that the performance of semiconductor chips is affected by the level of applied pressure in pressure-contact applications, such that under- or over-pressurisation can result in sub-optimal performance and poor reliability. In addition to this, the pressure that can be applied to the chips within the traditional design is not limited in any way, so they are vulnerable to both under- and over-pressurisation by the end-user.

The first (shown in prior art 2 below and also see FIG. 9) is to use extremely tightly toleranced components (typically matched to within 1 µm), to ensure component thicknesses are as closely matched as possible and to dictate that end-users provide clamp components (such as heatsinks and load spreaders) that have a much tighter flatness tolerance for multi-chip pressure contact devices than is used for traditional single chip pressure contact devices, such as large-area thyristors (e.g. typically 10 µm flatness tolerance, instead of 30 µm) (see prior art 3). Tight component tolerance ranges become hard to manage with large numbers of components, as is the case in large-area multi-chip pressure contact devices. Tight flatness tolerances for clamping components also become harder to achieve across a large surface area, compounding the problem.

The second approach is to use individual disc spring stacks in line with each individual semiconductor unit within the housing in order to reduce the force/displacement ratio. In this way, for a given difference in semiconductor unit thicknesses or a given flatness variation, the difference in contact pressure is minimised. As the disc springs are relatively poor electrical conductors, conductive metallic bypass strips (longitudinal current bypass) or stamped, contoured metal sheets (lateral current bypass) are used. Bypass strips run from the top to the bottom of the stack of disc springs. When the disc springs are compressed, the flexible bypass strip bows outwards. This arrangement is used in ABB's StakPak arrangement which is shown in FIG. 1. Due to the outward bow of the bypass strips, the packing density of chips may be limited, in turn limiting the current density of the finished device.

The stamped, contoured metal sheet is shaped as shown in FIG. 2 and incorporated in the finished device as shown in FIG. 3. It is described in patent number CN103579165, held by State Grid Corp China (prior art 4). As with the longitudinal current bypass strip method in FIG. 1, due to the shaping of the sheet, and the area required to form the sheet, the packing density of chips is limited, again limiting the current density of the finished device.

The third approach is to use a pressurised fluid to pressurise the contact components in the device. This has been detailed in patent JP2004158489, held by Honda Motor Co Ltd (prior art 5). This does, however, rely on the availability of pressurised fluid, which is feasible in hybrid vehicles, but less so in typical industrial and transmission and distribution applications. This approach is shown in FIG. 4.

Two approaches for applying correct applied pressure are known. Both apply only to the design using disc springs described above.

The first approach (as used in ABB's StakPak) uses the rigid insulative sleeve of the device housing as a travel-stop mechanism, which prevents depression of the external contact surfaces beyond a defined plane (prior art 2). The chips are grouped into sub-modules which contain the spring assemblies. Either four or six sub-modules are used in a finished device, each of which is individually tested before being assembled. The device specification requires the load to be sufficient to compress the external contact surfaces level with the top of the sleeve (referred to as the threshold load in this document). Beyond the threshold load, any excess load is supported by the sleeve and the load applied to the chips is then dictated by the load/displacement ratio of the spring system and increases no further, even with extra loading. The displacement is defined as the difference between the pre-load height of the spring stack and the loaded height of the spring stack, once the sleeve begins to carry the mechanical load. Therefore, this mechanism not only prevents over-pressurisation of the chips, but also prevents under-pressurisation of them when used correctly. In this design, only the sleeve supports load above the threshold load around the perimeter of the device, with no mechanical support provided in the centre of the device.

The second approach described in CN103579165 (prior art 4) uses a rigid insulative support frame inside the device housing to act as a travel stop mechanism. This acts in a similar manner to the perimeter travel stop mechanism described above. From the images given, it appears that load above the threshold load is supported in the centre of the device as well as at the edge. For this design to be tested or operated, the entire device must be fully assembled. Operation as a subassembly is not possible. The design is shown in FIG. 6.

Investigations of pressure distribution using tightly toleranced components in a 125 mm presspack package have found pressure uniformity to be very poor. Similar trials involving an IXYS UK Westcode 125 mm package may have also been found to have poor pressure distribution. Such difficulties achieving uniform clamping indicate that performance of the device as a whole is likely to be far from optimum. It has also been found that pressure distribution is greatly affected by the flatness of the clamping components that apply the mechanical load to the external pole faces of the device. Poor pressure distribution may have been seen even when using clamping components that were lapped flat and had measured flatnesses of around 5 μm across their entire device contact area, which is far flatter than called for in IXYS UK Westcode's application note in a press with adaptive heads, specially-designed to ensure parallelism between the upper and lower clamping surfaces.

Trends in patent activity over the past 25 years show a migration from rigid solutions for multi-chip pressure contact devices to solutions with enhanced compliance. These solutions include sprung solutions (ABB, Toshiba, Infineon, State Grid Corporation China) and solutions where the uniform pressure is provided by a pressurized fluid (Honda).

The only rigid solutions for which significant information has been found are those of IXYS UK Westcode, Toshiba and Fuji Electric. The Fuji Electric devices may not appear to be manufactured any longer. Little information can be found on the Toshiba devices, although they may be still advertised and sold. Recent published literature from IXYS UK Westcode large-area press-pack IGBT devices indicates that they may have reliability issues, which are suspected to result from pressure distribution problems (see prior art 6 and 7). These papers show that with a ΔTj of 78° C. the cycles to failure for an IXYS UK Westcode multi-chip pressure contact device is approximately 6,000 cycles for multi-chip pressure contact devices of rigid construction. This may compare unfavourably with single chip pressure contact devices, for which at a ΔTj of 80° C. the cycles to failure is far in excess of 100,000 cycles. Other published literature reviews have found by simulation that pressure uniformity may be grossly affected by micron-level differences in components in each chip's component stack.

Published literature is available on ABB's sprung solution, the StakPak, including case studies of HVDC Light schemes around the world using as many as 6,000 StakPak devices per scheme. One ABB presentation identifies 10 such schemes (prior art 1). According to ABB's own literature, their sprung solution has proven to be generally reliable in HVDC Light schemes. This published literature even provides details of failure rates, which appear to be relatively low.

It is expected that to create high reliability multi-chip packages, a more compliant solution than that offered by the rigid copper electrodes is required.

A mechanical prototype of the design has been produced. As its design intended, the pressure uniformity was greatly improved relative to that achieved with the traditional design device. This is shown below and in prior art 8.

In addition to the background description above, we also summarise the general prior art as follows:

Prior art 1—ABB (2014) High power semiconductors for T&D and industry application: StakPak & IGCT introduction Slide 18 shows 20 devices in one series stack.

Slide 19 states that by 2012 there were 10 HVDC Light projects using the ABB IGBT StakPak.

Prior art 2—ABB (2015) StakPak: IGBT press-pack modules

Page 3 shows operation of ABB StakPak with loading stops.

Prior art 3—IXYS UK Westcode (2015) Application note for device mounting instructions Surface flatness instructions indicate a flatness tolerance of 10 μm for multi-chip pressure contact devices as opposed to 30 μm for standard single chip pressure contact devices.

Prior art 4—Patent CN103579165—Full-pressure-welding power device—State Grid Corp China An example of a compliance approach using disc springs within a ceramic housing.

Prior art 5—Patent JP2004158489—Honda Motor Co Ltd

An example of a compliance approach using pressurised fluid to provide uniform loading to the pressure contact components within the device.

Prior art 6—Tinschert et al (2015)—Possible failure modes in Press-Pack IGBTs

This paper investigates the poor reliability of traditional design press-pack IGBT devices. The authors conclude that the premature failures are the result of a mixture of over-pressurisation and under-pressurisation of certain chips in a device. Under-pressurisation particularly affects chips located at the edge of the device. This paper shows that with a ΔTj of 78° C. the cycles to failure is approximately 6,000 cycles for an IXYS UK Westcode multi-chip pressure contact devices of rigid construction. This compares unfavourably with single chip pressure contact devices, for which at a ΔTj of 80° C. the cycles to failure is far in excess of 100,000 cycles.

Prior art 7—Frank (2014) Power Cycle Testing of Press-Pack IGBT Chips

This thesis details follow up work from the study by Tinschert et al (2015) (prior art 6). Individual press-pack IGBT chips are subjected to power cycling. The author found that individual chips have a lifetime that is orders of magnitude greater than fully-assembled devices.

SUMMARY OF THE INVENTION

Individual semiconductor chips can be connected in parallel within a single pressure contact housing to provide a single device containing multiple chips with a current handling capability that is ideally the sum of the capability of all the chips contained within the housing.

According to one aspect of the present invention, there is provided a semiconductor device sub-assembly comprising:
  a plurality of semiconductor units laterally spaced to one another;
  a semiconductor unit locator comprising a plurality of holes, wherein each semiconductor unit is located in each hole of the semiconductor unit locator;
  a plurality of pressure means for applying pressure to each semiconductor unit, and
  a conductive malleable layer located between the plurality of pressure means and the semiconductor unit locator.

The conductive malleable layer may be a flat diaphragm. The conductive malleable layer may be a continuous layer without a contoured area in the malleable layer. The conductive malleable layer may be a flexible layer. The conductive malleable layer may comprise a material comprising copper, aluminium, silver and an alloy of copper, aluminium and silver.

The pressure means may comprise a spring. The spring can be any type of springs for example a disc spring.

The sub-assembly may further comprise a spring locator comprising a plurality of holes, wherein each pressure means is located in each hole of the spring locator.

The spring locator may be operatively connected with the conductive malleable layer.

The sub-assembly may further comprise a first thrust pad and a second thrust pad within the holes of the spring locator on both sides of the pressure means, wherein the first thrust pad is protruded from a first surface of the spring locator and the second thrust pad is in contact with the conductive malleable layer. The first and second thrust pad may each comprise a material comprising a hard metal.

The pressure means may be selected such that a predetermined pressure is exerted using the spring locator, the pressure means, the first thrust pad and the second thrust pad. The predetermined pressure may be applied to a threshold pressure limit so that the applied pressure compresses each pressure means to a degree that a lower most surface of the first thrust pad is in line with a lower most surface of the spring locator.

The threshold pressure limit to each pressure means may be about 1 Kilo Newton.

The applied pressure above the threshold pressure limit may be supported by the spring locator and the semiconductor unit locator. The spring locator and the semiconductor unit locator may be connected to one another using a fixing means.

The fixing means may comprise non-conductive screws.

The sub-assembly may further comprise a printed circuit board on the conductive malleable layer, the printed circuit board is configured to distribute a control signal applied to a control terminal of the semiconductor unit.

The printed circuit board may comprises a plurality of holes, each hole being associated with each semiconductor unit and with each pressure means.

The sub-assembly may further comprise a conductive block in each hole of the printed circuit board. The conductive block may be operatively connected with the conductive malleable layer and the semiconductor unit. The conductive block may comprise a material comprising copper, aluminium, silver and an alloy of these materials.

The sub-assembly may be configured such that after the pressure is applied a first conductive path is established through the spring locator, conductive malleable layer, conductive block and the semiconductor unit.

The sub-assembly may be configured such that after the pressure is applied a second conductive path is established through the first thrust pad, the pressure means, the second thrust pad, the conductive malleable layer, the conductive block to the semiconductor unit.

The semiconductor unit may comprise:
a semiconductor chip;
a protection layer at the edge of the semiconductor chip;
a front side strain buffer;
a back side strain buffer;
a control terminal connection spring pin.

Each hole of the semiconductor unit locator may have a square shape.

The shape of each hole of the semiconductor unit locator may control the applied pressure distribution to each semiconductor unit so that the applied pressure is distributed substantially uniformly in a central region of the sub-assembly.

The semiconductor unit locator may comprise a high temperature material comprising polyether ether ketone (PEEK).

According to a further aspect of the present invention, there is provided a method for manufacturing a semiconductor device sub-assembly, the method comprising:
providing a plurality of semiconductor units laterally spaced to one another;
providing a semiconductor unit locator comprising a plurality of holes,
wherein each semiconductor unit is located in each hole of the semiconductor unit locator;
providing a plurality of pressure means for applying pressure to each semiconductor unit, and
providing a conductive malleable layer located between the plurality of pressure means and the semiconductor unit locator.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
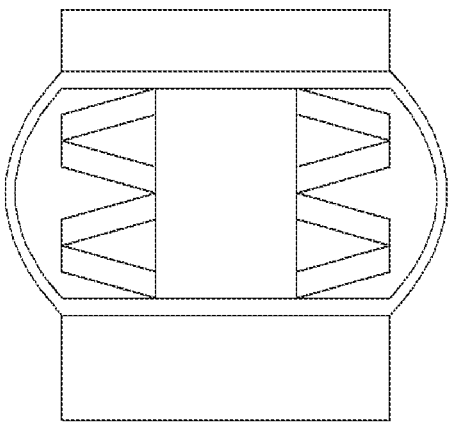
FIG. 1 illustrates disc spring stack and current bypass strips according to prior art.
Figure 2:
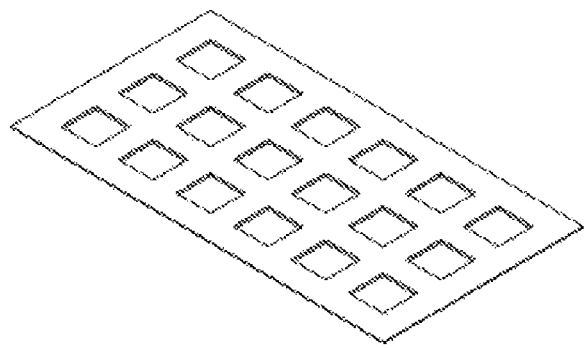
FIG. 2 illustrates a stamped, contoured metal sheet according to prior art.
Figure 3:
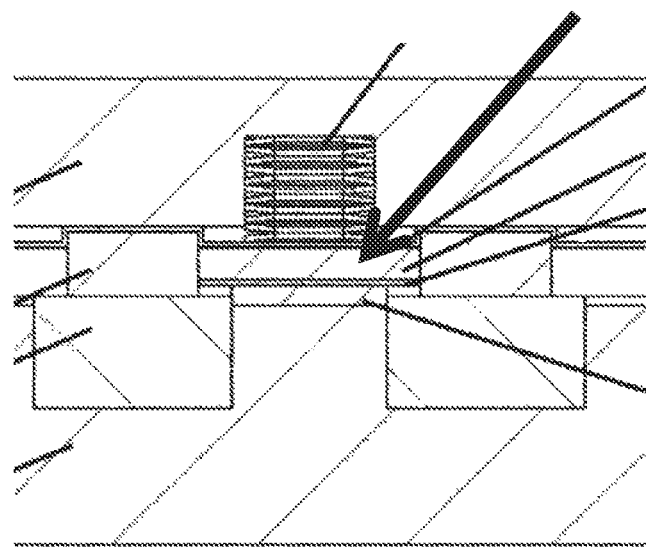
FIG. 3 illustrates a stamped, contoured metal sheet incorporated in a finished device (solid arrow) according to prior art.
Figure 4:
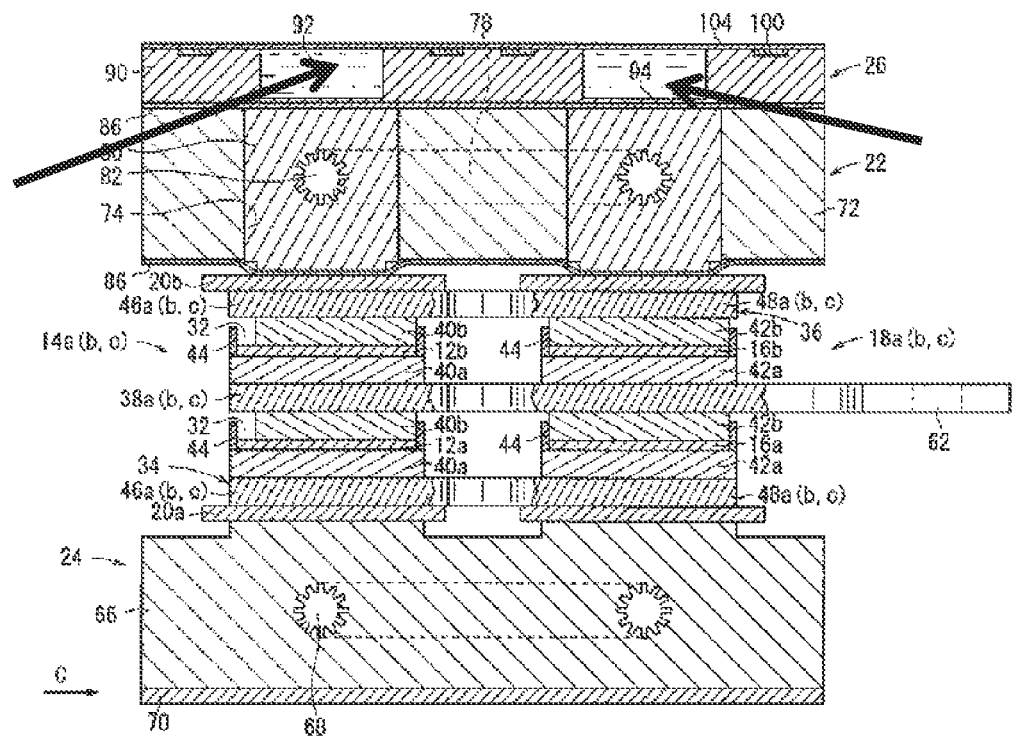
FIG. 4 illustrates a fluid pressure used to apply contact pressure to chips (fluid channels shown with solid arrows) according to prior art.
Figure 5:
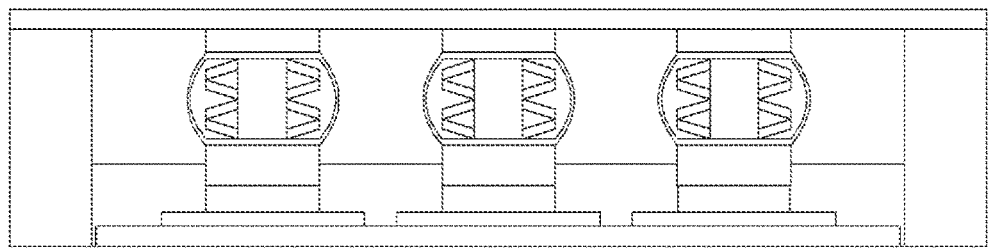
FIG. 5 illustrates the operation of ABB's StakPak in which a rigid insulative sleeve is shown in dark grey/blue according to prior art.
Figure 6:
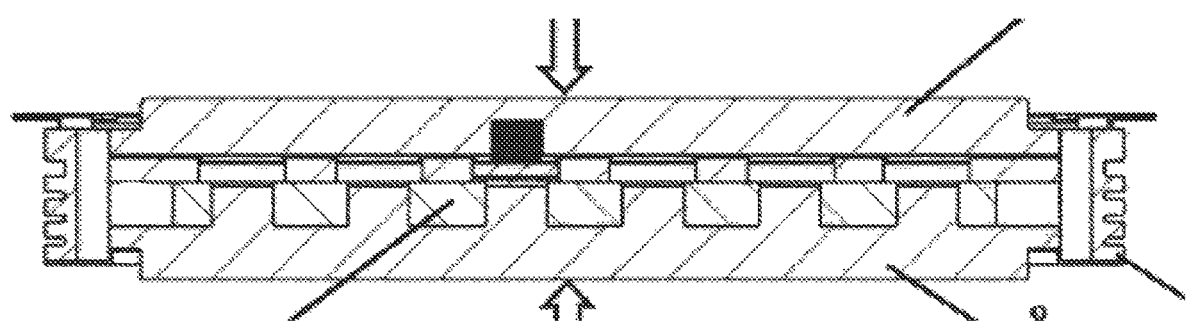
FIG. 6 illustrates a rigid insulative support frame inside housing, identified by a solid arrow according to prior art.

FIGS. 7 to 16 (excluding FIG. 9) generally describes different embodiments of the present invention. In these figures, the following components are used with reference to the following reference numerals.

Figure 7:
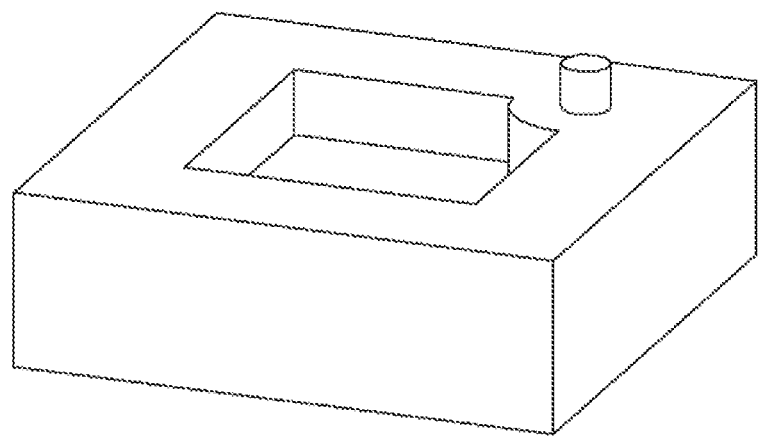
FIG. 7 illustrates a three-dimensional view of a finished semiconductor unit according to one embodiment of the present invention.

1—a semiconductor unit;
2—a semiconductor chip—in this application is either an Insulated Gate Bipolar Transistor or Fast Recovery Diode, but other types of chips could be used;
3—moulded locator—polyether ether ketone (PEEK) or other high temperature plastic
4—Frontside strain buffer—molybdenum, but could be tungsten or an alloy of molybdenum and copper or tungsten and copper;
5—Backside strain buffer—same as frontside strain buffer;
6—Control terminal connection spring pin—may be a gold-plated stainless steel;
7—Device housing base/main electrode—copper;
8—Control signal distribution printed circuit board—standard high-temperature PCB material;
9—Device housing lid/main electrode—copper;
10—Spring locator—copper, but could be any suitably conductive metal, such as aluminium, silver, or an alloy of these;
11—First thrust pad—steel (preferably a stainless steel), but could be any suitable hard metal;
12—Disc spring stack—a standard grade of high-temperature spring steel;
13—Second thrust pad—same as first thrust pad;
14—Conductive diaphragm—copper, but could be any suitably conductive, malleable metal, such as aluminium or silver, or an alloy of these;
15—Conductive block—copper, but could be any suitably conductive metal, such as aluminium, silver, or an alloy of these;
16—Semiconductor unit locator—polyether ether ketone (PEEK) or other high temperature plastic;
60—metal electrode;

FIG. 7 illustrates a three-dimensional view of a finished semiconductor unit according to one embodiment of the present invention.

Figure 8:
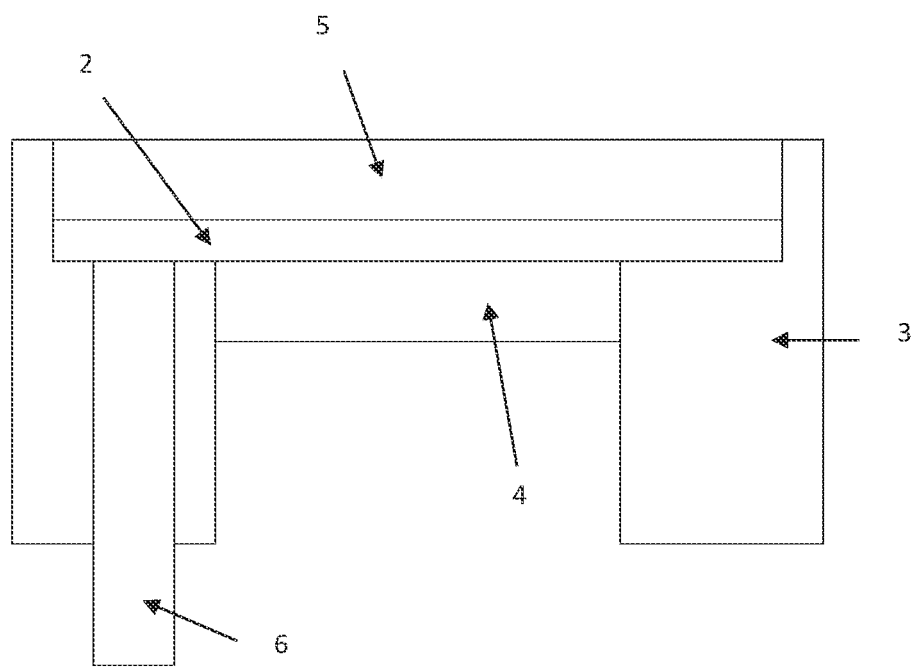
FIG. 8 illustrates a schematic cross-section of a semiconductor unit according to one embodiment of the present invention.
Figure 9:
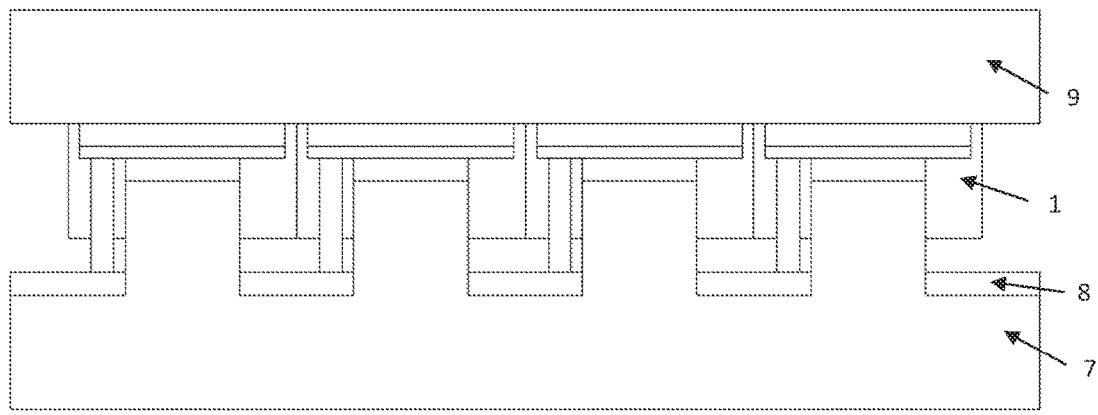
FIG. 9 illustrates a schematic cross-section of an assembled device of a prior art construction containing multiple semiconductor units.

FIG. 8 illustrates a schematic cross-section of the semiconductor unit of FIG. 7. In one embodiment, the semiconductor unit 1 includes a semiconductor chip 2, for example, an insulated gate bipolar transistor (IGBT), metal oxide semiconductor field effect transistor (MOSFET), bipolar junction transistor (BJT) or any other type of semiconductor devices. The unit includes a frontside strain buffer 4 and a backside strain buffer 5. The unit 1 also includes a control terminal connection spring pin 6. The unit 1 also includes a moulded locator 3 that serves to locate the frontside strain buffer 4, backside strain buffer 5 and control terminal connection spring pin 6 relative to the semiconductor chip 2.

Figure 10:
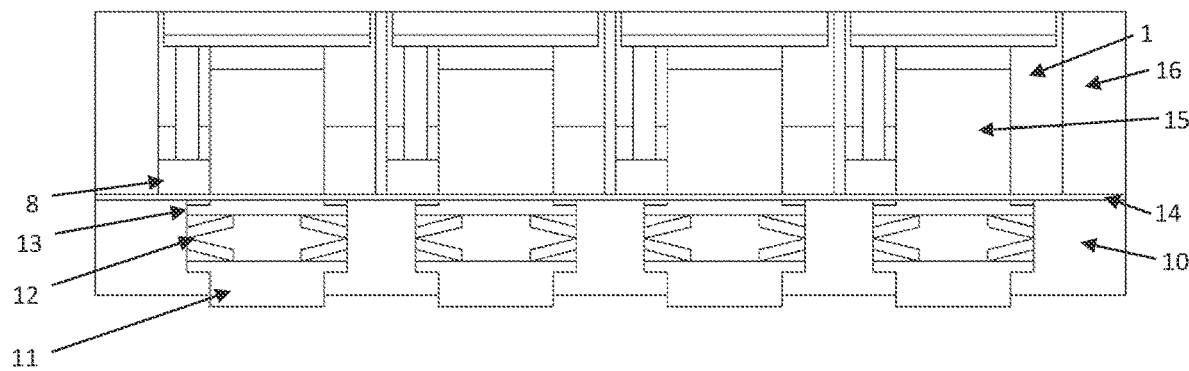
FIG. 10 illustrates a schematic cross-section of a semiconductor sub-assembly according to one embodiment of the present invention.
Figure 11:
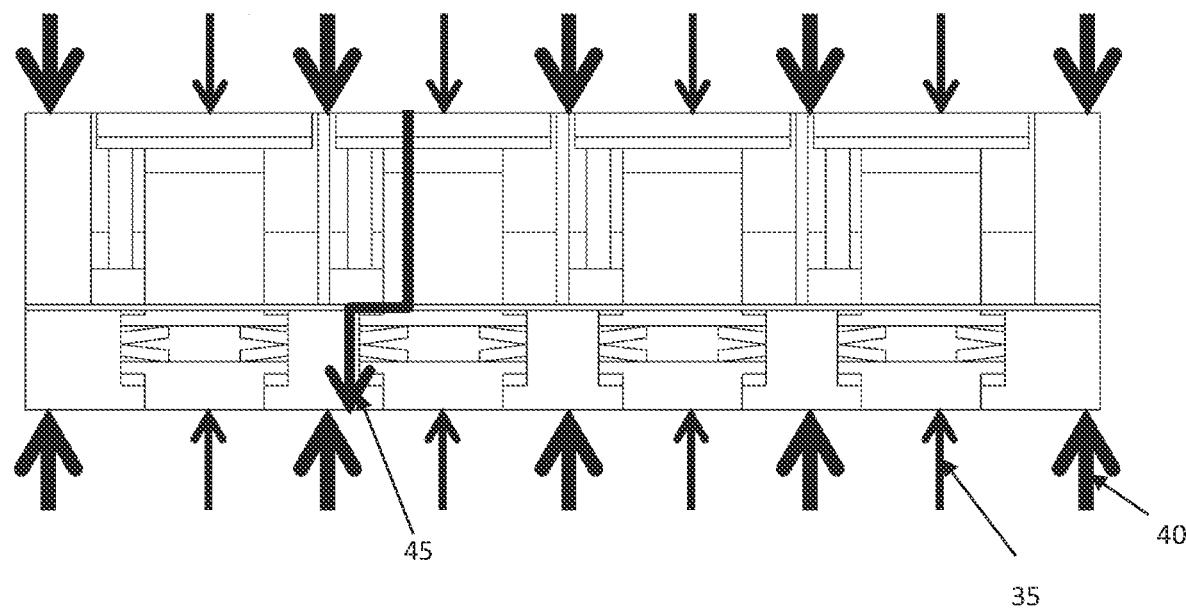
FIG. 11 illustrates a demonstration of conductive path (solid arrow through the device) and mechanical load transmission (solid arrows outside the device) once the invention is mechanically loaded; thin solid blue arrows indicate load on chips and thick solid blue arrows indicate the transmission of load above the threshold load to the sub-assembly frame.

FIG. 10 illustrates a schematic cross-section of a semiconductor sub-assembly according to one embodiment of the present invention. The invention is generally a multiple-chip semiconductor device sub-assembly that incorporates for example stacks of disc springs in line with each semiconductor unit, uses an internal support frame (combination of spring locator and semiconductor unit locator) to limit the displacement of the disc springs and provides current bypass of the disc springs using a disc with multiple through holes and a flat, malleable, conductive diaphragm (or the conductive malleable layer). The invention is generally shown in FIGS. 10 and 11.

The technical aspects of the embodiments of the invention are as follows:

1. The sub-assembly uses a flat, malleable, conductive diaphragm and disc with multiple through holes (elements 14 and 10 in FIG. 10) to provide the current bypass path. The use of this approach wastes minimal contact area, compared to the longitudinal bypass strips that bow laterally or the stamped, contoured metal sheet that requires area to accommodate the formed contours and so permits the maximum chip packing density and therefore the maximum current density for the finished device of all current bypass methods available.

2. The design may be a fully-functional sub-assembly, utilising both disc springs for improved pressure uniformity and a travel-stop mechanism to prevent over-pressurisation of the chips that contains the full number of chips present in the final device. It does not require the final outer packaging—typically a ceramic housing—for testing to be carried out or in fact to be used in an end-user's application, if that were ever desired. All other designs using disc springs encountered do require final assembly to be fully functional. Since large-area ceramic housings are expensive components and failure of the device results in irreparable damage to the contact surfaces within the ceramic housing, a cost-saving can be recognised by testing the sub-assembly before packaging, since some manufacturing yield loss is to be expected.

In the embodiment of FIG. 10, the first thrust pads 11, disc spring stacks 12 and a second thrust pad 13 are inserted into holes in the spring locator 10. The disc spring stacks 12 are selected to exert the required pressure on the component stack at a displacement determined by the combined height of the first thrust pad 11, disc spring stack 12 and the second thrust pad 13, minus the height of the spring locator 10.

Furthermore, over the top of the spring locator 10 is placed a conductive diaphragm 14. This has a thickness adequate to carry the required current, but is thin enough to flex with the movement of the disc spring stack 12 under load.

Onto the conductive diaphragm 14 is placed a control signal distribution printed circuit board 8. This distributes the control signal applied to the single control terminal of the finished device to each of the individual semiconductor chips 2 within the device. Into holes in the control signal distribution printed circuit board 8 are placed conductive blocks 15. Over these are then placed a semiconductor unit locator 16 with an array of square through-holes. Into each of the square through-holes is placed a semiconductor unit 1. The semiconductor unit 1 in this application comprises a semiconductor chip 2 with protection from electrical breakdown at the edge of the chip 3, frontside 4 and backside 5 strain buffers and a control terminal connection spring pin 6 (only for chips with a control terminal). At this stage, the semiconductor unit locator 16 is typically fixed to the spring locator 10 using non-conductive screws or another appropriate method, securing all loose components inside the subassembly.

The invention may subsequently be assembled into a traditional ceramic capsule or other appropriate power semiconductor housing (not shown).

FIG. 11 illustrates a conductive path (solid arrow through the device) 45 and mechanical load transmission (solid arrows outside the device) 35, 40 once the invention is mechanically loaded; thin solid blue arrows 35 indicate load on chips and thick solid blue arrows 40 indicate the transmission of load above the threshold load to the sub-assembly frame. In one embodiment, the invention is operated by clamping the whole device to a load greater than that which depresses the disc springs in each component stack to such a degree that the lowermost surface of the first thrust pad 11 is brought into line with the lowermost surface of the spring locator 10 (the threshold load). The threshold load for each spring stack is designed to be 1 kN. In this example, there are 44 spring stacks in the current design, so the threshold load for the whole sub-assembly is therefore 44 kN. Beyond the threshold load, all extra load is supported by the semiconductor unit locator 16 and the spring locator 10. The rated load for the whole device is 50-70 kN, so the excess load supported by the semiconductor unit locator 16 and spring locator 10 is from 6 to 26 kN. At this point, the individual chips are each generally optimally loaded. They are protected from over-pressurisation by the support frame and, given that the device is loaded in excess of the threshold load, they are generally not under-pressurised either. Once pressurised correctly, a conductive path is established, through the spring locator 10, conductive foil or diaphragm 14, conductive block 15 to the semiconductor unit 1 (see FIG. 11). A second conductive path is also established from the first thrust pad 11, disc spring stack 12, second thrust pad 13, conductive foil 14 and conductive block (15) to the semiconductor unit 1.

It will be appreciated that the load on each threshold load of each spring stack may be determined by the load required for optimum pressure contact to the semiconductor chip. This is determined by balancing electrical and thermal conductivity of the pressure contact with the long-term reliability. A higher force will result in better conductivity, but a shorter lifetime, whereas a lower force will result in poor conductivity and longer lifetime.

The skilled person would appreciate that so far only a mechanical prototype has been produced. The threshold load of 1 kN has been estimated. Once full testing is possible, the load of 1 kN may be changed. It is expected to remain within the range 0.5 to 2.0 kN.

Finished devices of different diameters may be manufactured in future. The will require whole device clamping forces that differ from the 50-70 kN specified for the prototype. The device may have a 225 mm electrode, but even bigger are possible. The smallest device may have a 47 mm electrode.

The excess load over the threshold load may be necessary to create a good pressure contact between the conductive diaphragm and the spring locator. The excess load may be about 6 to 26 kN, but this may need to be increased to an even higher force, if the conductivity of the contact is not good enough.

The device may be circular or may be square, although other shapes are possible. The diaphragm 14 thickness may be about 0.3 mm, preferably in a range about 0.1 mm to 1 mm. The diaphragm 14 is flexible because of dimensional tolerances so that it is able to move. The diaphragm 14 may be made of copper, aluminium, silver or an alloy of these materials.

The front side 4 and backside 5 strain buffers may or may not be attached to the semiconductor chip 2 by soldering or silver sintering.

The conductive block 15 and the frontside strain buffer 4 may be formed of one piece of material. This may or may not be attached to the frontside of the semiconductor chip 2 by soldering or silver sintering.

Figure 12:
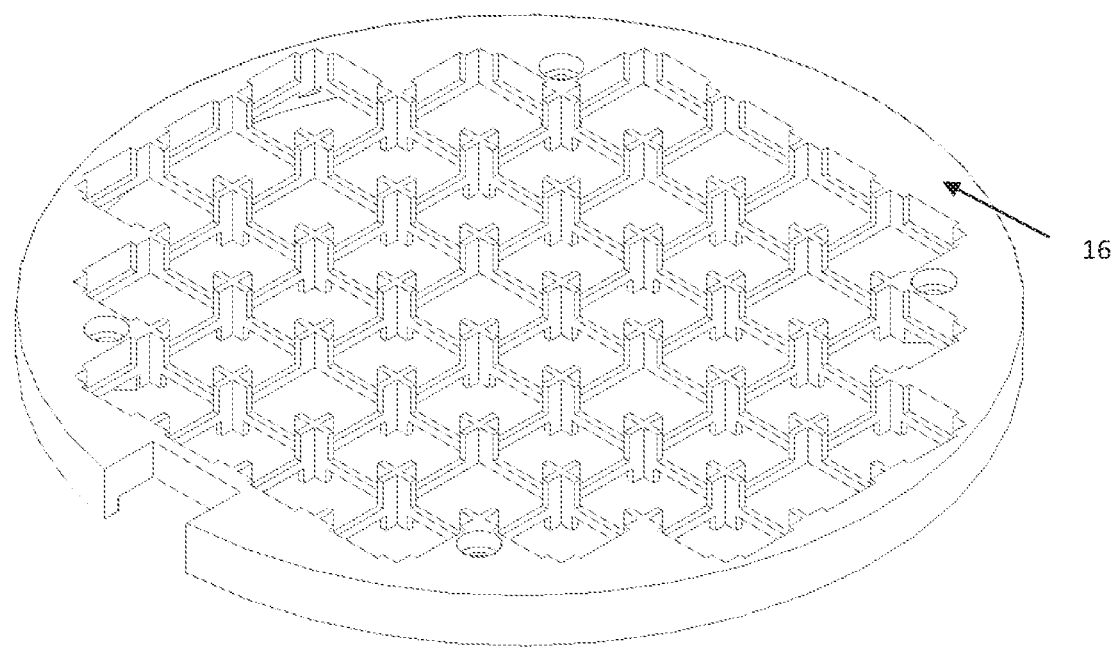
FIG. 12 illustrates a schematic representation of a semiconductor unit locator according to one embodiment of the present invention.

FIG. 12 illustrates a schematic representation of a semiconductor unit locator 16 according to one embodiment of the present invention. The unit locator 16 has square shaped through holes in which the semiconductor unit is located. There are cross-shaped boundaries for each hole which are very useful for providing uniform pressure at the central region of the sub-assembly.

Figure 13:
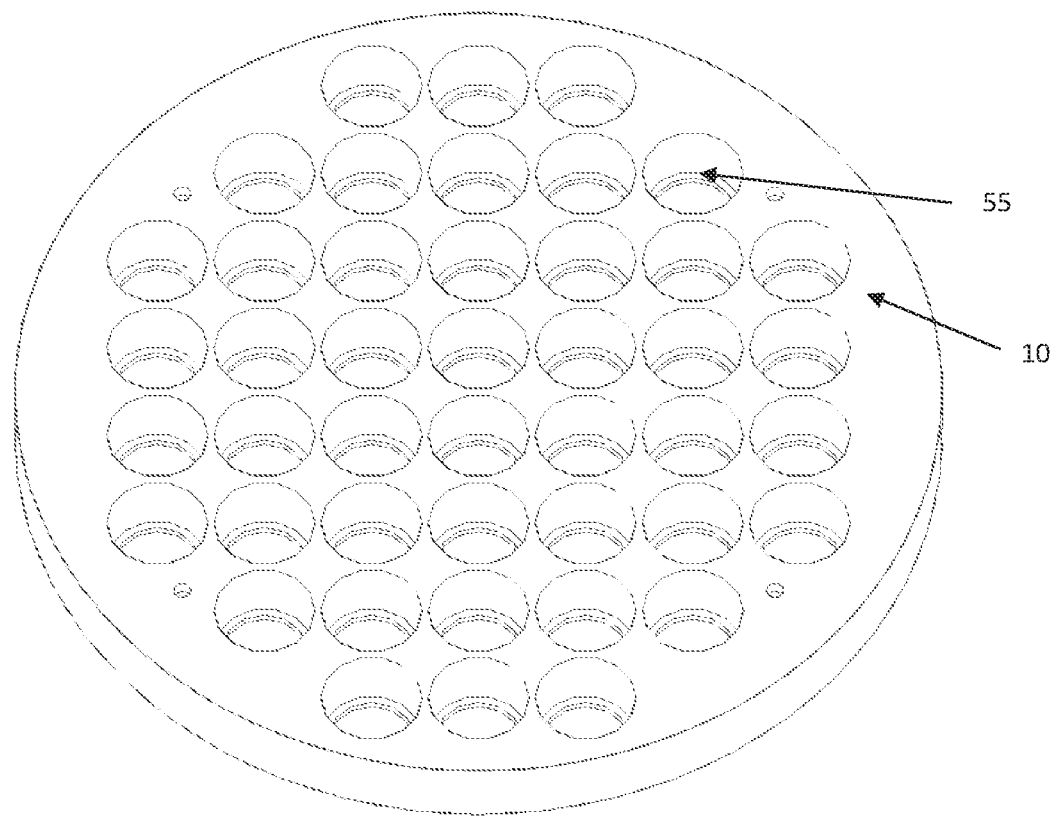
FIG. 13 illustrates a representation of a spring locator.

FIG. 13 illustrates a representation of a spring locator 10 including through holes 55.

Figure 14:
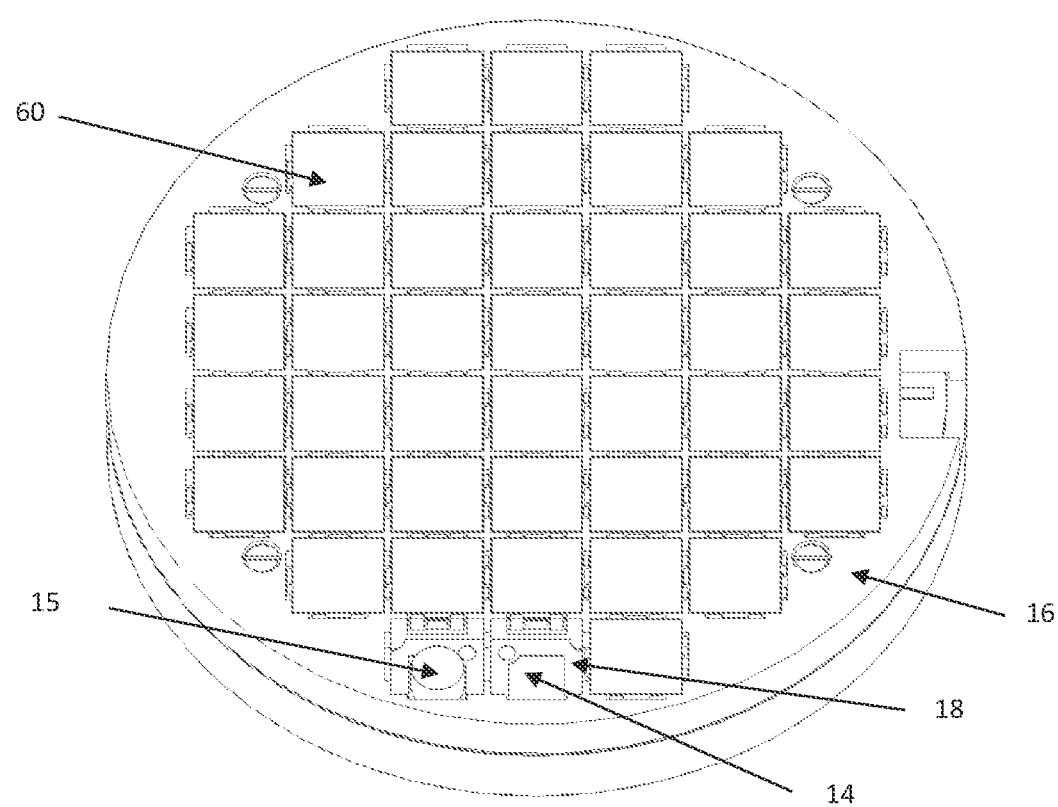
FIG. 14 illustrates a representation of a semi-assembled sub-assembly.

FIG. 14 illustrates a representation of a semi-assembled sub-assembly comprising semiconductor unit locator 16, diaphragm 14, printed circuit board 18 having square holes, conductive block 15, and backside strain buffers 5.

Figure 15:
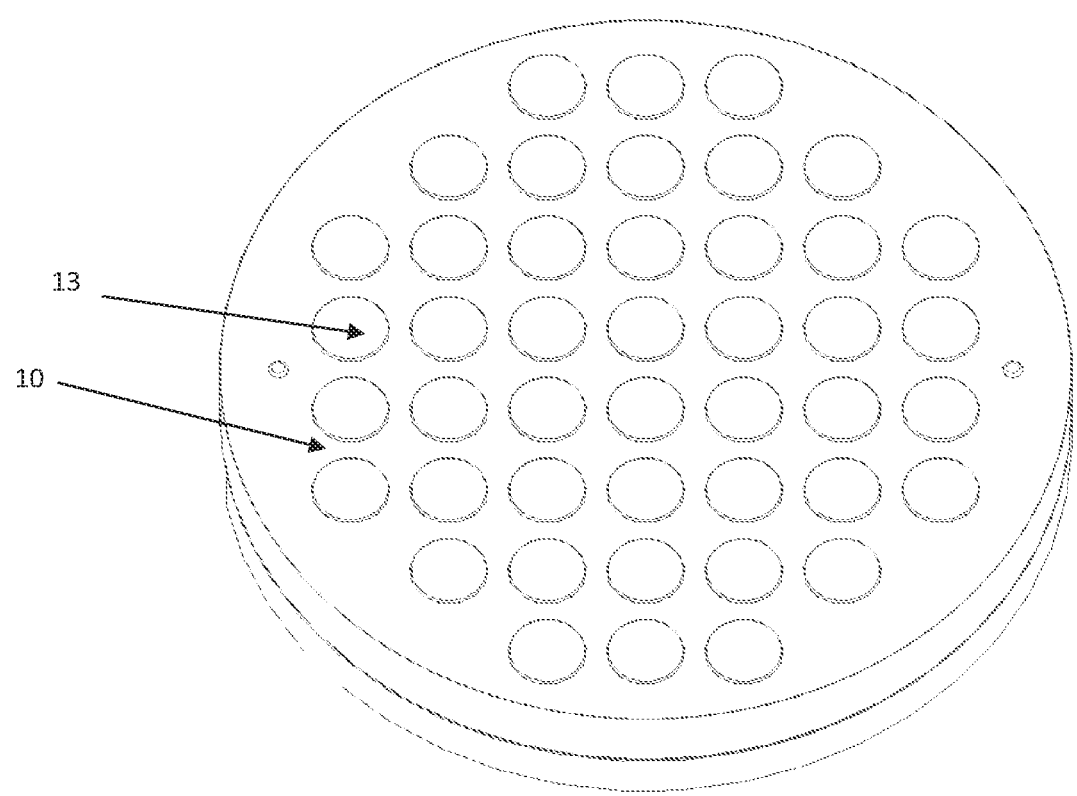
FIG. 15 illustrates a representation of a spring locator including thrust pads.

FIG. 15 illustrates a representation of a spring locator 10 including thrust pads 13.

Although the above mentioned description is directed to a power semiconductor device chip but it would be appreciated that other semiconductor devices could also be possible to use in this invention.

The skilled person will understand that in the preceding description and appended claims, positional terms such as 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein

The invention claimed is:

1. A semiconductor device sub-assembly comprising:
   a plurality of semiconductor units laterally spaced to one another in a first direction;
   a semiconductor unit locator comprising a plurality of through-holes extending completely through the semiconductor unit locator in a second direction, wherein each semiconductor unit is located in a through-hole of the semiconductor unit locator;
   a plurality of springs for applying pressure to each semiconductor unit;
   a conductive malleable layer located between the plurality of springs and the plurality of semiconductor units located in the semiconductor unit locator, and
   a spring locator comprising a plurality of holes, wherein each spring is located in a hole of the spring locator, wherein the semiconductor unit locator overlaps the spring locator in the second direction, and each spring overlaps a semiconductor unit and the conductive malleable layer in the second direction, wherein the first direction and the second direction are different directions, and wherein the second direction is perpendicular to an upmost surface of the semiconductor device sub-assembly.

2. The semiconductor device sub-assembly according to claim 1, wherein the conductive malleable layer is a flat diaphragm; and/or
   wherein the conductive malleable layer is a continuous layer without a contoured area in the malleable layer; and/or
   wherein the conductive malleable layer is a flexible layer.

3. The semiconductor device sub-assembly according to claim 1, wherein the conductive malleable layer comprises a material comprising copper, aluminium, silver, or an alloy of copper, aluminium and silver.

4. The semiconductor device sub-assembly according to claim 1, wherein the spring locator is operatively connected with the conductive malleable layer.

5. The semiconductor device sub-assembly according to claim 1, further comprising a first thrust pad and a second thrust pad within the holes of the spring locator on both sides of the springs, wherein the first thrust pad is protruded from a first surface of the spring locator and the second thrust pad is in contact with the conductive malleable layer.

6. The semiconductor device sub-assembly according to claim 5, wherein the first and second thrust pad each comprise a material comprising a metal.

7. The semiconductor device sub-assembly according to claim 5, wherein the springs are selected such that a predetermined pressure is exerted using the spring locator, the springs, the first thrust pad and the second thrust pad.

8. The semiconductor device sub-assembly according to claim 7, wherein the predetermined pressure is applied to a threshold pressure limit so that the predetermined pressure compresses each spring to a degree that a lower most surface of the first thrust pad is in line with a lower most surface of the spring locator.

9. The semiconductor device sub-assembly according to claim 8,
wherein the threshold pressure limit to each spring is about 1 Kilo Newton; and/or,
wherein the applied pressure above the threshold pressure limit is supported by the spring locator and the semiconductor unit locator.

10. The semiconductor device sub-assembly according to claim 1,
wherein the spring locator and the semiconductor unit locator connected to one another using a fixing means; and optionally,
wherein the fixing means comprises non-conductive screws.

11. The semiconductor device sub-assembly according to claim 1, further comprising a printed circuit board on the conductive malleable layer, the printed circuit board is configured to distribute a control signal applied to a control terminal of the semiconductor unit.

12. The semiconductor device sub-assembly according to claim 11, wherein the printed circuit board comprises a plurality of holes, each hole being associated with each semiconductor unit and with each spring.

13. The semiconductor device sub-assembly according to claim 12, further comprising a conductive block in each hole of the printed circuit board.

14. The semiconductor device sub-assembly according to claim 13,
wherein the conductive block is operatively connected to the conductive malleable layer and the semiconductor unit; and optionally
wherein the conductive block comprises a material comprising copper, aluminium, silver, or an alloy of copper, aluminium, and silver.

15. The semiconductor device sub-assembly according to claim 1,
wherein the semiconductor device sub-assembly is configured such that after the pressure is applied a first conductive path is established through the spring locator, conductive malleable layer, conductive block and the semiconductor unit; and/or
wherein the semiconductor device sub-assembly is configured such that after the pressure is applied a second conductive path is established through the first thrust pad, the springs, the second thrust pad, the conductive malleable layer, the conductive block and the semiconductor unit.

16. The semiconductor device sub-assembly according to claim 1, wherein the semiconductor unit comprises:
a semiconductor chip;
a protection layer at an edge of the semiconductor chip;
a front side strain buffer;
a back side strain buffer;
a control terminal connection spring pin.

17. The semiconductor device sub-assembly according to claim 1,
wherein each hole of the semiconductor unit locator has a square shape; and optionally
wherein the shape of each hole of the semiconductor unit locator controls the applied pressure distribution to each semiconductor unit so that the applied pressure is distributed substantially uniformly in a central region of the sub-assembly.

18. The semiconductor device sub-assembly according to claim 1, wherein the semiconductor unit locator comprises a material comprising polyether ether ketone (PEEK).

19. A method for manufacturing a semiconductor device sub-assembly, the method comprising:
providing a plurality of semiconductor units laterally spaced to one another in a first direction;
providing a semiconductor unit locator comprising a plurality of through-holes extending completely through the semiconductor unit locator in a second direction, wherein each semiconductor unit is located in a through-hole of the semiconductor unit locator;
providing a plurality of springs for applying pressure to each semiconductor unit;
providing a conductive malleable layer located between the plurality of springs and the plurality of semiconductor units located in the semiconductor unit locator; and
providing a spring locator comprising a plurality of holes, wherein each spring is located in a hole of the spring locator,
wherein the semiconductor unit locator overlaps the spring locator in the second direction, and each spring overlaps a semiconductor unit and the conductive malleable layer in the second direction, wherein the first direction and the second direction are different directions, and wherein the second direction is perpendicular to an upmost surface of the semiconductor device sub-assembly.

20. A semiconductor device sub-assembly comprising:
a plurality of semiconductor units laterally spaced to one another in a first direction;
a semiconductor unit locator comprising a plurality of through-holes extending completely through the semiconductor unit locator in a second direction, wherein each semiconductor unit is located in a through-hole of the semiconductor unit locator;
a plurality of springs for applying pressure to each semiconductor unit;
a conductive malleable layer located between the plurality of springs and the plurality of semiconductor units located in the semiconductor unit locator; and
a spring locator comprising a plurality of through-holes extending completely through the spring locator in the second direction, wherein each spring is located in a through-hole of the spring locator, wherein the semiconductor unit locator overlaps the spring locator in the second direction, and wherein each spring overlaps a semiconductor unit and the conductive malleable layer in the second direction, wherein the first direction and the second direction are different directions.

\* \* \* \* \*

UNITED STATES PATENT AND TRADEMARK OFFICE
CERTIFICATE OF CORRECTION

PATENT NO.        : 11,195,784 B2
APPLICATION NO.   : 16/311780
DATED             : December 7, 2021
INVENTOR(S)       : Robin Adam Simpson It is certified that error appears in the above-identified patent and that said Letters Patent is hereby corrected as shown below:

On the Title Page

Item (73) Assignee:
Add --ZHUZHOU CRRC TIMES ELECTRIC CO. LTD., Hunan (CN)--

Signed and Sealed this
Thirteenth Day of September, 2022

Katherine Kelly Vidal
*Director of the United States Patent and Trademark Office*